United States Patent
Selken

(10) Patent No.: US 9,699,922 B1
(45) Date of Patent: Jul. 4, 2017

(54) INTERACTIVE AUDIO PASS-THROUGH DEVICE

(71) Applicant: APS Customs, LLC, Vilonia, AR (US)

(72) Inventor: Andrew Selken, Vilonia, AR (US)

(73) Assignee: APS Customs, LLC, Vilonia, AR (US)

( * ) Notice: Subject to any disclaimer, the term of this patent is extended or adjusted under 35 U.S.C. 154(b) by 300 days.

(21) Appl. No.: 14/661,209

(22) Filed: Mar. 18, 2015

Related U.S. Application Data

(60) Provisional application No. 61/969,508, filed on Mar. 24, 2014.

(51) Int. Cl.
  *H05K 5/04* (2006.01)
  *H05K 5/02* (2006.01)
  *H05K 5/00* (2006.01)

(52) U.S. Cl.
  CPC ......... *H05K 5/0004* (2013.01); *H05K 5/0086* (2013.01); *H05K 5/0247* (2013.01)

(58) Field of Classification Search
  CPC ... H05K 5/0004; H05K 5/0086; H05K 5/0247
  USPC ........................................................ 361/752
  See application file for complete search history.

(56) References Cited

U.S. PATENT DOCUMENTS

| | | | |
|---|---|---|---|
| 6,035,962 A * | 3/2000 | Lin ........................... | H04R 1/02 181/148 |
| 6,430,537 B1 | 8/2002 | Tedesco et al. | |
| 7,577,717 B2 | 8/2009 | Smith | |
| 7,783,703 B2 | 8/2010 | Rafey et al. | |
| 8,315,555 B2 | 11/2012 | Ko et al. | |
| 8,458,356 B2 | 6/2013 | Weel | |
| 8,484,227 B2 | 7/2013 | Svendsen | |
| 8,584,175 B2 | 11/2013 | Nathan et al. | |
| 2007/0136446 A1 | 6/2007 | Rezvani et al. | |
| 2007/0214182 A1 | 9/2007 | Rosenberg | |
| 2008/0194196 A1 | 8/2008 | Angelhag et al. | |
| 2010/0228740 A1 | 9/2010 | Cannistraro et al. | |
| 2011/0283236 A1 | 11/2011 | Beaumier et al. | |
| 2012/0233067 A1 | 9/2012 | Matthew et al. | |
| 2013/0246916 A1 | 9/2013 | Reimann et al. | |
| 2013/0273944 A1 * | 10/2013 | Wilson .................. | H04M 1/026 455/457 |

OTHER PUBLICATIONS www.sonos.com dated Mar. 18, 2015.

* cited by examiner

*Primary Examiner* — Eric Thomas
*Assistant Examiner* — Michael P McFadden
(74) *Attorney, Agent, or Firm* — Head, Johnson, Kachigian & Wilkinson, PC

(57) ABSTRACT

The invention generally relates to an interactive audio pass-through device constructed as a portable unit that houses Wi-Fi and/or Bluetooth wireless hardware and software, a microprocessor for processing a unique queuing algorithm for a plurality of users, and a plurality of colored light sources for visually indicating the queue to the users. The queuing algorithm assigns specific Bluetooth codes to users' Bluetooth devices, and a user software application loaded on the users' Bluetooth enabled devices allows the device to stream content wirelessly using its unique Bluetooth code to the interactive audio pass-through device. The microprocessor also allows private interactive chats among users in the queue, and also includes administrator control software to allow the unit's owner to set parameters for the unit.

17 Claims, 3 Drawing Sheets

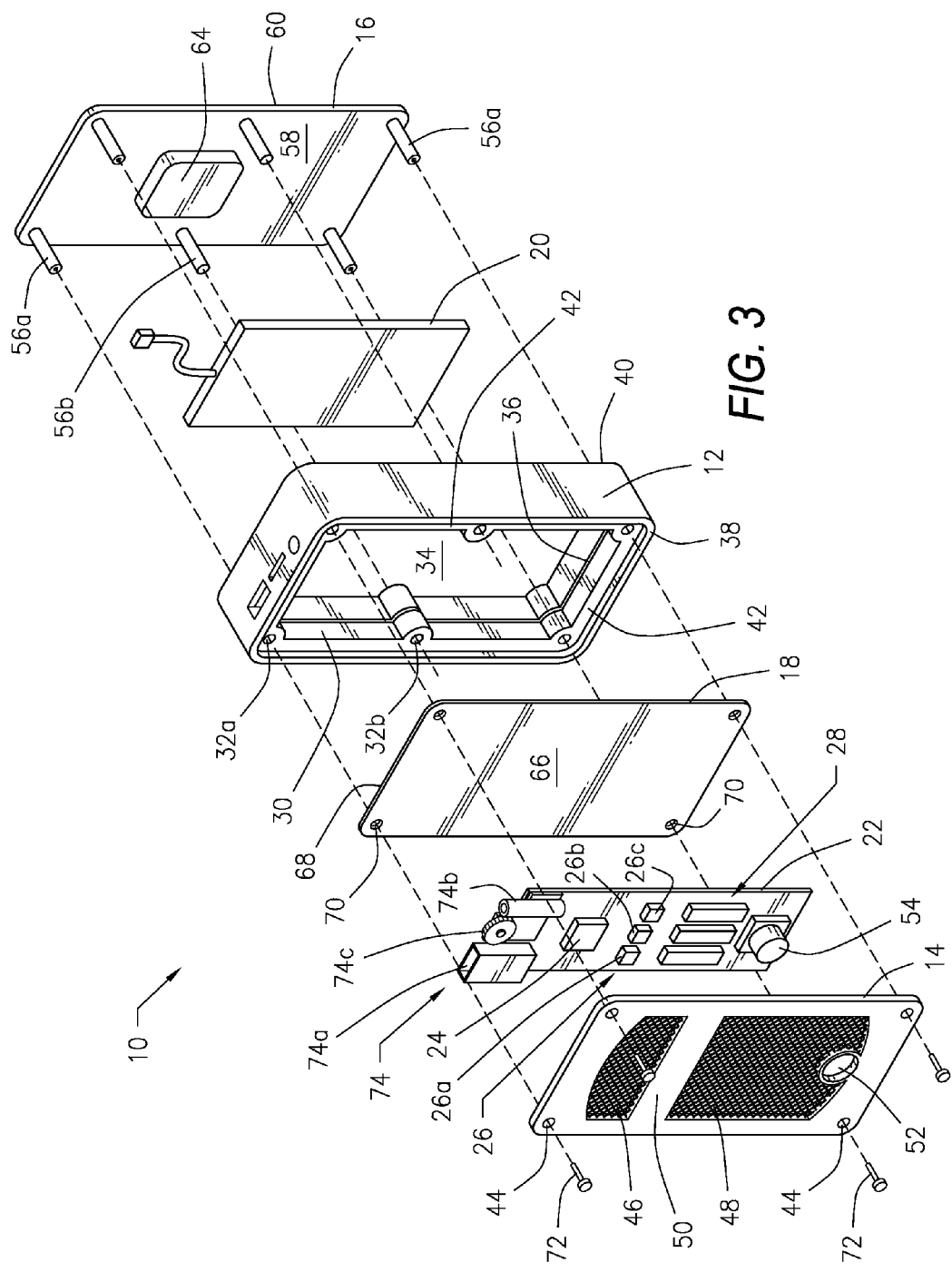

_US 9,699,922 B1_

INTERACTIVE AUDIO PASS-THROUGH DEVICE

CROSS REFERENCE TO RELATED APPLICATIONS

This application claims the benefit of U.S. Provisional Patent Application Ser. No. 61/969,508, entitled "Interactive Audio Pass-Through Device," filed Mar. 24, 2014, which is incorporated herein by reference in its entirety.

STATEMENT REGARDING FEDERALLY SPONSORED RESEARCH OR DEVELOPMENT

Not Applicable.

NAMES OF THE PARTIES TO A JOINT RESEARCH AGREEMENT

Not Applicable.

REFERENCE TO A SEQUENCE LISTING, A TABLE, OR A COMPUTER PROGRAM LISTING APPENDIX

Not Applicable.

BACKGROUND OF THE INVENTION

1. Field of the Invention

The invention generally relates to an interactive audio pass-through device, and more particular to an interactive audio pass-through device constructed as a portable unit that houses Bluetooth and wireless hardware and software, a microprocessor for processing a unique queuing algorithm for a plurality of users, and a plurality of colored light sources for visually indicating the queue to the users.

2. Description of the Related Art

Some current devices allow up to five (5) devices to connect to a Bluetooth enabled speaker, and a user then has the ability to "heist" the speaker and play a particular song in lieu of whatever was playing. However, with these devices, there is no control of the song playing, which can be changed as soon as someone else choose to play another song.

It is therefore desirable to provide an improved interactive audio pass-through device.

It is further desirable to provide an interactive audio pass-through device constructed as a portable unit that houses wireless hardware and software, a microprocessor having a unique queuing algorithm for a plurality of users, and a plurality of colored light sources for visually indicating the queue to the users.

It is still further desirable to provide an interactive audio pass-through device having three (3) Bluetooth chips (i.e., an audio output chip, an audio input chip and a communications chip) that allow an endless amount of users to connect to the device without buffering and can be played through any speaker that has Bluetooth or an auxiliary port.

Other advantages and features of the invention are apparent from the following description and from the claims.

BRIEF SUMMARY OF THE INVENTION

In general, the invention relates to an interactive audio pass-through device comprising a core housing, a front plate, a rear plate and an electronics tray. The core housing has a peripheral frame with a plurality of fastener apertures. The core housing also has a central opening with an inner groove. A front face and a rear face of the frame of the core housing each respectively have a recessed edge. The front plate has a plurality of fastener apertures axially aligned with the fastener apertures in the frame of the core housing. The front plate also has an upper arched opening and a lower arched opening separated by an intermediate band. The front plate includes a power button aperture. The rear plate has a plurality of fastener posts protruding from an inner face of the rear plate. The fastener posts positioned in corners of the rear plate are axially aligned with the fastener apertures in the core housing and the fastener apertures in the front plate, while the fastener posts positioned along a midline of the rear plate are axially aligned with the fastener apertures positioned along a midline of the core housing. The electronics tray is secured within the groove of the frame of the core housing. The electronic tray has a plurality of fastener apertures axially aligned with the fastener apertures in the core housing, with the fastener apertures in the front plate and with the fastener posts positioned in the corners of the rear plate. The electronics tray also includes a power source and a motherboard mounted thereto, with the motherboard having a microprocessor, wireless and/or Bluetooth electronic hardware and at least one colored light source.

The device can be constructed with a height of about six (6) inches, a width of about three (3) inches, and a depth of about one and one-half (1½) inches. The recessed edge on the front face of the frame of the core housing may have a thickness generally equal to a thickness of the front plate, while the recessed edge on the rear face of the frame of the core housing may have a thickness generally equal to a thickness of the rear plate. Similarly, the front plate can be generally flush with the front face and the rear plate may be generally flush with the rear face of the frame of the core housing. The core housing can be constructed of a vibration absorbing material, such as a polymer rubber composite. In addition, the upper arched opening and/or the lower arched opening can include a formed mesh insert. Further, a set of cutouts can be along an outer face of the rear plate, with the cutouts being covered by a box mounted to an inner face of the rear plate.

The electronics tray can be constructed of an insulative material, such as aluminum. The power source, such as a lithium ion battery, may be mounted to a rear face of the electronics tray, while the motherboard may be mounted to a front face of the electronics tray. The light source can be three (3) light emitting diodes mounted to a front face of the motherboard. The light sources may be aligned with the lower arched opening in the front plate of the device. Additionally, the interactive audio pass-through device can include input components, such as a micro USB port, an audio auxiliary port and an adjustable wheel to control the brightness of the light sources. The electronic hardware of the interactive audio pass-through device can include a Bluetooth audio input chip, a Bluetooth audio output chip, and a Bluetooth communications chip. Moreover, the interactive audio pass-through device can include physical device software, owner software, and user software.

BRIEF DESCRIPTION OF THE DRAWINGS

FIG. 3 is a front exploded perspective view of the interactive audio pass-through device shown in FIG. 1.

DETAILED DESCRIPTION OF THE INVENTION

Figure 1:
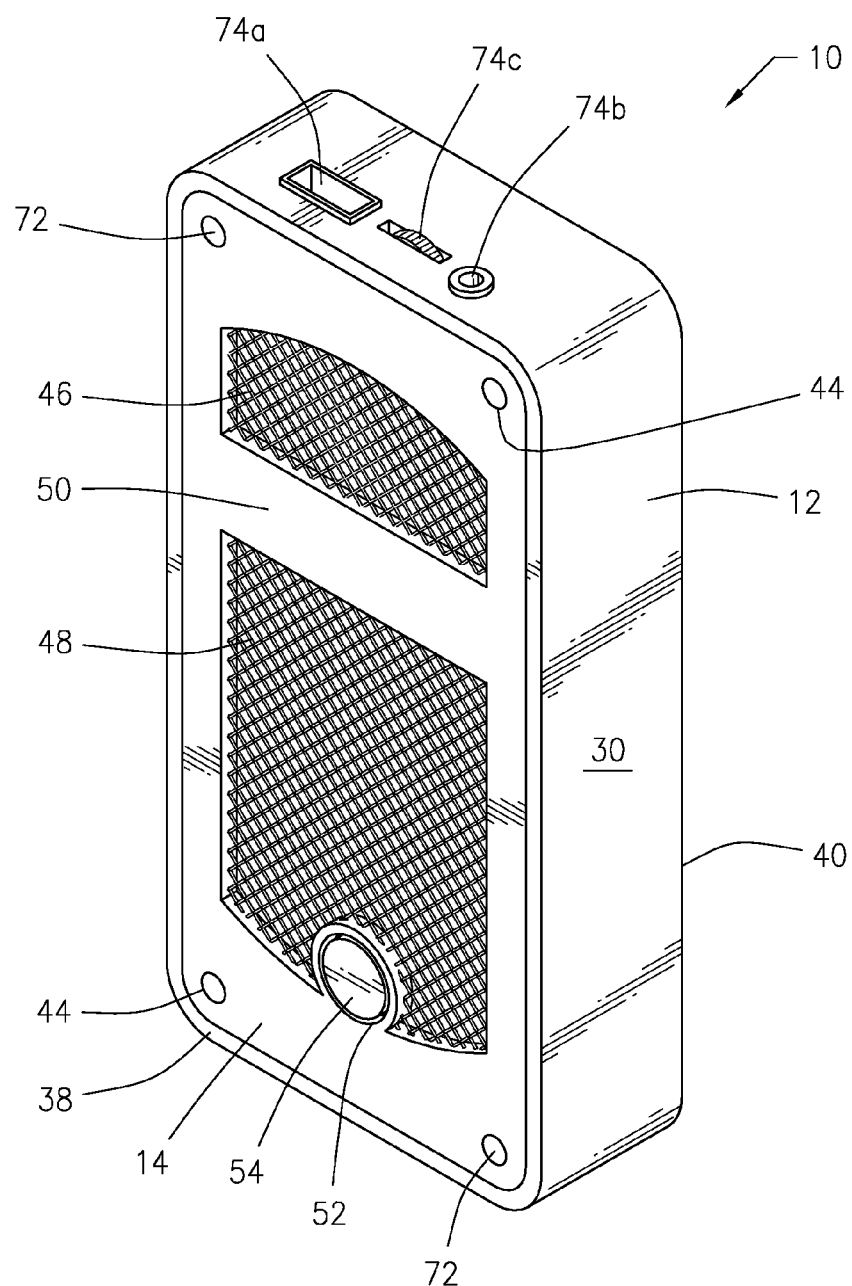
FIG. 1 is a front perspective view of an illustrative example of the interactive audio pass-through device disclosed herein.

The processes and devices discussed herein are merely illustrative of specific manners in which to make and use this invention and are not to be interpreted as limiting in scope.

While the processes and devices have been described with a certain degree of particularity, it is to be noted that many variations and modifications may be made in the details of the sequence and the arrangement of the processes and devices without departing from the scope of this disclosure. It is understood that the processes and devices are not limited to the embodiments set forth herein for purposes of exemplification.

The description of the invention is intended to be read in connection with the accompanying drawings, which are to be considered part of the entire written description of this invention. In the description, relative terms such as "front," "rear," "lower," "upper," "horizontal," "vertical," "above," "below," "up," "down," "top" and "bottom" as well as derivatives thereof (e.g., "horizontally," "downwardly," "upwardly" etc.) should be construed to refer to the orientation as then described or as shown in the drawings under discussion. These relative terms are for convenience of description and do not require that the machine be constructed or the method to be operated in a particular orientation. Terms, such as "connected," "connecting," "attached," "attaching," "join" and "joining" are used interchangeably and refer to one structure or surface being secured to another structure or surface or integrally fabricated in one piece.

The invention provides an interactive audio pass-through device. Various aspects of the invention described herein may be applied to any of the particular applications set forth below. It shall be understood that different aspects of the invention can be appreciated individually, collectively, or in combination with each other.

Referring to the figures of the drawings, wherein like numerals of reference designate like elements throughout the several views, the interactive audio pass-through device 10 is constructed as a portable unit having a core housing 12, a front plate 14, a rear plate 16, and an electronics tray 18 for mounting a power source 20 and a motherboard 22 having a microprocessor 24, wireless and Bluetooth hardware 26, at least one colored light source 28 and any other electronic components. By way of example and not limitation, the device 10 may have a height of about six (6) inches, a width of about three (3) inches, and a depth of about one and one-half (1½) inches.

The core housing 12 includes a peripheral frame 30 having a plurality of fastener apertures 32. The core housing 12 also includes a central opening 34 having an inner groove 36 for receipt of the electronics tray 18. In addition, both a front face 38 and a rear face 40 of the frame 30 of the core housing 12 include a recessed edge 42 having a thickness equal to the thickness of the front plate 14 and the rear plate 16, respectively. When fastened to the core housing 12, the front plate 14 and the rear plate 16 are generally flush mounted with the front face 38 and the rear face 40 of the frame 30. The core housing 12 is preferably constructed of a polymer rubber composite, but the device 10 is not so limited, the core housing 12 can be made of any other suitable material to aid in vibration absorption.

The front plate 14 has a plurality of fastener apertures 44 that are axially aligned with the fastener apertures 32 in the frame 30 of the core housing 12. The front plate 14 also includes an upper arched opening 46 and a lower arched opening 48 separated by an intermediate band 50. Both the upper arched opening 46 and the lower arched opening 48 may include formed mesh inserts as illustrated. The front plate 14 also includes a power button aperture 52 through which a power button 54 that is mounted to the motherboard 22 is accessible. The front plate 14 may be constructed of any suitable material, including but not limited to twenty-six (26) gauge steel or other material sufficiently transparent to allow the light sources 28 mounted to the underlying electronics tray 18 to be visible.

The rear plate 16 has a plurality of fastener posts 56 protruding from an inner face 58. As illustrated, the fastener posts 56a in the corners of the rear plate 16 that are axially aligned with the fastener apertures 32a in the core housing 12 and the fastener apertures 44 in the front plate 14 include a threaded or unthreaded central bore, while the fastener posts 56b along the midline of the rear plate 16 do not include such central bore. The midline fastener posts 56b pass through the fastener apertures 32b along the midline of the core housing 12 to prevent the core housing 12 from bending outwardly during use. In addition, the rear plate 16 includes a set of cutouts 62 along an outer face 60 to allow a clip (not shown) to attach to the device 10 to mount for home or mobile environments. The cutouts 62 are covered by a box 64 mounted to the inner face 58 of the rear plate 16.

The electronics tray 18 may be constructed of aluminum or other suitable material for mounting electronic components thereto. The power source 20 is mounted to a rear face 66 of the electronics tray 18, and the motherboard 22 is mounted to a front face 68 of the electronics tray 18. The electronics tray 18 is secured within the groove 36 of the frame 30 of the core housing 12, and includes a plurality of fastener apertures 70 axially aligned with the fastener apertures 44 in the front plate 14 and the fastener apertures 32 in the core housing 12.

The device 10 is secured together to form a portable unit by passing fasteners 72 through the axially aligned apertures 44, 70 and 32 in the front plate 14, electronics tray 18, and the core housing 12, and securing the fasteners 72 to the fastener posts 56a protruding from the front face 58 of the rear plate 16.

The power source 20 may be a lithium ion battery or other suitable power source for portable devices having an approximate size of around 2000 mah, and may be housed within a soft case to allow maximum energy storage. The power source 20 may also include a near field communication (NFC) chip to allow a faster connection.

The motherboard 22 may be made of fiberglass and is secured to the electronics tray 18. The motherboard 22 has the power button 54, the microprocessor 24, the light sources 28, the Bluetooth and wireless components 26, input components 74 and other electronic components mounted thereto. As illustrated, the light source 28 comprises three (3) light emitting diodes (LEDs) mounted to a front face of the motherboard 22, and the light sources 28 are aligned with the lower arched opening 48 in the front plate 14 of the device 10. Also mounted to the motherboard 22 are the suitable input components 74, namely a micro USB port 74a, an audio output such as a 3.5 mm auxiliary port 74b, and an adjustable wheel 74c to control the brightness of the light sources 28. The wireless components 26 may include three (3) Bluetooth chips, namely an audio input chip 26a, an audio output chip 26*b*, and a communications chip 26*c*, with each of the wireless components 26 being controlled by the microprocessor 24.

It shall be understood that this invention may be used with any user mobile device, such as cellular phones, smartphones (e.g., iPhone, BlackBerry, Android, Treo); tablets (e.g., iPad, Galaxy Tab, Kindle Fire, Surface); a wireless device such as a wireless email device; certain network devices such a tablet; personal digital assistants (PDAs) such as a Palm-based device or Windows CE device; other devices capable of communicating wirelessly with a computer network or other communication network; or any other type of mobile device that may communicate over a network and handle electronic transactions. The users' mobile device may be handheld. The mobile device may use specialized programs or applications. Any discussion herein of devices may also be applied to any other mobile devices as provided. Further, although users' connecting devices will generally be described as mobile devices herein, in some implementations, the users' devices may include fixed devices, such as desktop computers, media centers, or other computing devices that are not designed for portability, but are equipped with wireless communication components.

The microprocessor 24 and a memory of the interactive audio pass-through device 10 may store an operating system (OS) and a plurality of applications or "apps." The memory may be capable of storing non-transitory computer readable media comprising code, logic, or instructions to perform one or more steps, such as steps of the apps. The microprocessor 24 may be capable of executing the one or more steps defined by the non-transitory computer readable media. The microprocessor 24 may be capable of executing one or more steps of the methods provided herein to queue portable devices. The applications may be native functionality incorporated into the OS of the device 10 or may be third party applications installed by the manufacturer or user of the device 10.

It shall be understood that the memory of the device 10 may include non-removable memory or removable memory. The non-removable memory may consist of RAM, ROM, a hard disk, or other well-known memory storage technologies. The removable memory may include any well-known memory storage technologies, such as "smart cards." Applications could be installed and/or implemented in either the removable memory or the non-removable memory. Memory may include volatile and non-volatile memory. Volatile memory may include memory that requires power to retain information. Non-volatile memory may include memory that can retain information, even when it is not powered, such as include read-only memory, flash memory, ferroelectric RAM (F-RAM), most types of magnetic computer storage devices (e.g. hard disks, floppy disks, and magnetic tape), and/or optical discs.

It shall be further understood that the interactive audio pass-through device 10 and the users' mobile devices may have one or more software applications (apps) to carry out instructions. In some instances, one or more of the apps may generate an identifier (e.g., device identifier) and store the identifier in shared storage. One or more steps of the application may be implemented by non-transitory and/or tangible computer readable media which may contain instructions, logic, data, or code that may be stored in persistent or temporary memory of the mobile device, or may somehow affect or initiate action by the computer or other device. In some embodiments, the processes and devices disclosed herein may be associated with an application programming interface (API) or with a software development kit (SDK) that allows third parties to easily incorporate additional functionality for generating, storing and using the interactive audio pass-through device 10.

The communications network connects a number of devices and/or processes to the interactive audio pass-through device 10. As noted above, the devices and/or processes may include any mobile device. The network may be a local area network (LAN) or wide area network (WAN) such as the Internet. The network may be a personal area network, a telecommunications network such as a telephone network, cell phone network, mobile network, a wireless network, a data-providing network, or any other type of network. The communications may utilize wireless technology, such as Bluetooth or RTM technology. Alternatively, various communication methods may be utilized, such as a dial-up wired connection with a modem, a direct link such as TI, ISDN, or cable line. In some embodiments, a wireless connection may be using exemplary wireless networks such as cellular, satellite, or pager networks, GPRS, or a local data transport system such as Ethernet or token ring over a LAN. In some embodiments, the device may communicate wirelessly using infrared communication components.

Any of the processing steps described herein may occur with aid of the microprocessor 24. The microprocessor 24 may be a processor of the interactive audio pass-through device 10 and the users' mobile devices.

The interactive audio pass-through device 10 described herein may include three (3) sets of operating software: physical device software; owner software; and user software. The physical device software creates the electronic queue for user devices and sends out appropriate Bluetooth codes when the next song starts to connect to the audio input chip 26*a*. The audio output chip 26*a* is used to connect to a Bluetooth speaker, or if the interactive audio pass-through device 10 is connected using the auxiliary output port 74*b*, the audio output chip 26*b* will also be used for communications. The physical device software also allows an open chat that can be sent to all user devices inside of queue or a private chat to a single user through the use of usernames configured in the user software.

The owner software is run through an application, and is downloaded through the network from a suitable provider, such as iTunes or Google Play. Using the owner software, an administrative user can create a passcode to stop other users from changing settings and/or connecting to the interactive audio pass-through device 10. In addition, the owner software can be configured to limit the number of users and/or devices, to connect to a Wi-Fi communications network, and to block explicit or undesired content.

The user software will be downloaded as an "app" on compatible devices. The user software allows the Bluetooth code to be set in queue and enables the user to choose the next song from the user's library to be added to the queue. The user software can create a Bluetooth code and username to allow quick connections between the interactive audio pass-through device 10 and users' devices. In addition, the queue is a continuing electronic list that moves the audio input chip 26*a* to the next Bluetooth code on the queue and allows the user software to begin streaming the particular content. The interactive audio pass-through device 10 does not store content, but rather streams the content from the audio input chip 26*a* through the microprocessor 24 to the audio output chip 26*b*, thereby allowing the communication chip 26*c* to stay open to allow others to connect and the chat to move smoothly.

For example, the user software can be configured to allow a user to add up to three (3) songs to the queue and may provide a reminder when the last song begins to play to ensure there is no skip in the queue. The user will also be able to change the settings inside of the user software to change the color of the light source 28 when the user's content is playing, allow chats to be shown and to download a song through a third party if the user likes what is playing from another user's device. The light sources 28 may be configured to illuminate to show which particular users' content is being played back through the interactive audio pass-through device 10, and the next users in the queue. For example, once a user selects a particular color, that color may be locked so that no other user can select the same identifying color. The chat is used with the Bluetooth coding if the user wants other users to see a message, and then the user software will open a chat message. The user can also send a private message to a single Bluetooth code.

During operation, a user will first download and install the user software on their device. Then with either NFC or through the user software, the user can connect to the appropriate interactive audio pass-through device 10, at which point the user will acquire a Bluetooth code to communicate with the interactive audio pass-through device 10. Once the user software has been closed, the user will be disconnected from the interactive audio pass-through device 10.

As noted above, the interactive audio pass-through device 10 can be constructed with three (3) Bluetooth chips 26 *a/b/c* for quick connection, or allow the user to manually put the interactive audio pass-through device 10 into a sync mode by holding down the power button 54 for a predetermined amount of time, such as five (5) seconds, in order to locate any nearby Bluetooth speakers. The interactive audio pass-through device 10 will then connect the output chip 26*b* to the paired Bluetooth speaker; if no Bluetooth speaker is available, the interactive audio pass-through device 10 can be connected to a speaker using the auxiliary output port 74*b*. Once the interactive audio pass-through device 10 has connected via the audio output chip 26*b* or been connected to the auxiliary output port 74*b*, the communication chip 26*c* opens a communications port to allow user devices to begin connecting to the electronic queue.

When the user software application attempts to connect to the interactive audio pass-through device 10, the interactive audio pass-through device 10 will add the Bluetooth code of the user's device to the electronic queue once correct password has been entered by the user. The interactive audio pass-through device 10 can then send a direct message to the first user device through the communication chip 26*c* to allow the user device to sync to the audio input chip 26*a* of the interactive audio pass-through device 10. The communication chip 26*c* does not sync to the user device but sends direct messages via the Bluetooth code. When a particular song ends, if the user has another song in the queue, the microprocessor 24 will drop the Bluetooth code to the bottom of the electronic queue. In addition, the communication chip 26*c* will send notification to the next user device to allow a faster connection once a song playing ends and the audio input chip 26*a* will connect as soon as the previous song has ended.

Once the user device and the interactive audio pass-through device 10 are connected, the user can choose up to three (3) songs or other content from their device playlist or can select a shuffle pattern that will continue to add songs. Once the user has the last song playing, a notification will alert the user that more songs are needed; if the user does not select more songs by the end of their last track, the Bluetooth code will be dropped from queue at the end of the song. Additionally, once songs are selected, the user has the ability to chat with other users through the wireless network, to play one-on-one games, as well as to select a color choice.

At any time the administrative user may configure the interactive audio pass-through device 10 through the owner software, change settings of the interactive audio pass-through device 10, configure restrictions for certain Bluetooth codes, such as to block explicit content if needed.

Figure 2:
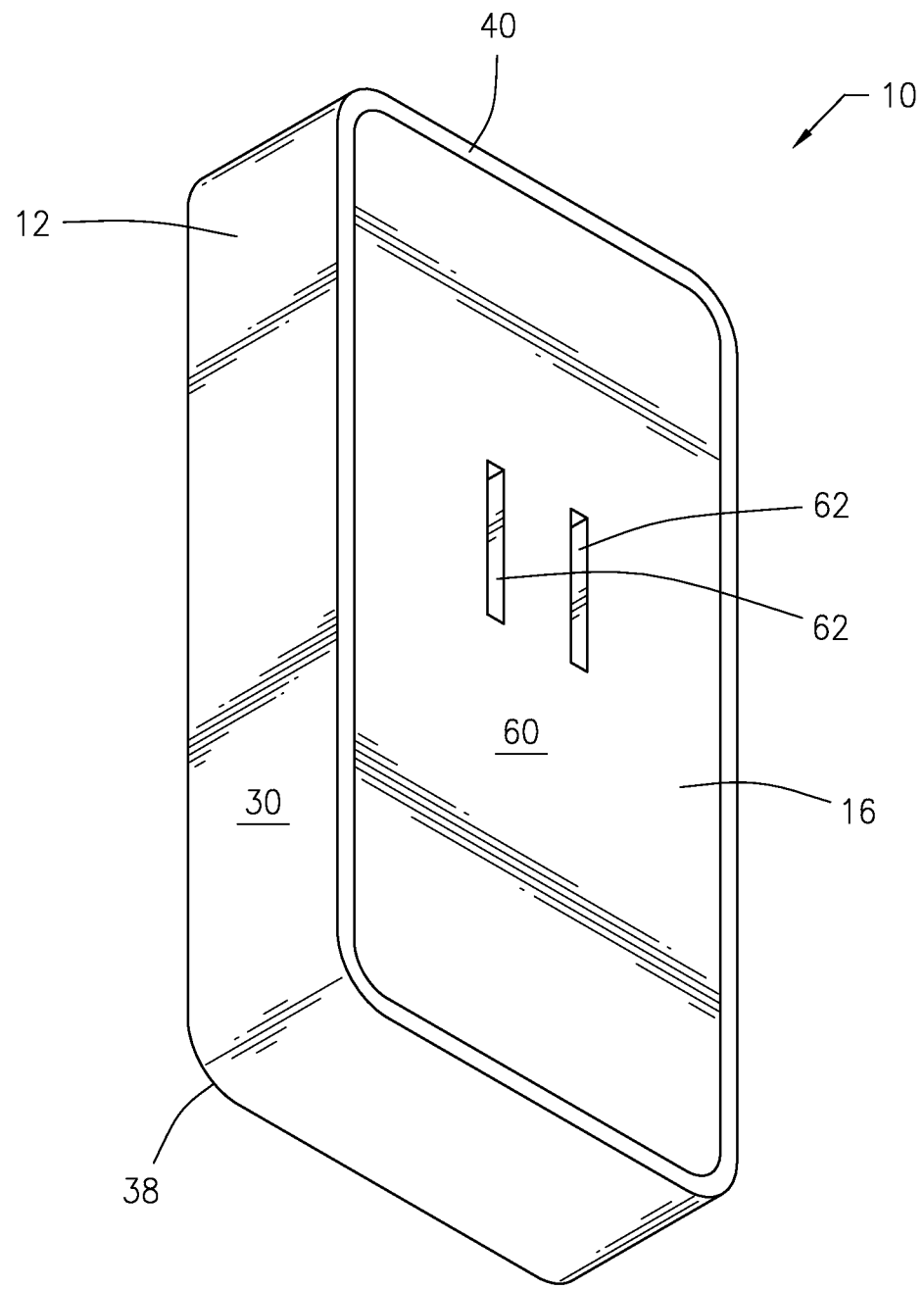
FIG. 2 is a bottom perspective view of the interactive audio pass-through device shown in FIG. 1.

Whereas, the processes and devices have been described in relation to the drawings and claims, it should be understood that other and further modifications, apart from those shown or suggested herein, may be made within the scope of this invention. Moreover, although the figures shows example components of the interactive audio pass-through device, in other implementations, the interactive audio pass-through device may contain fewer components, different components, differently arranged components, or additional components than those depicted in FIGS. 1 through 3. Alternatively, or additionally, one or more components of the interactive audio pass-through device may perform one or more tasks described as being performed by one or more other components of the interactive audio pass-through device.

What is claimed is:

1. An interactive audio pass-through device, comprising: a core housing comprising a peripheral frame having a plurality of fastener apertures, said core housing further comprising a central opening having an inner groove, and a front face and a rear face of said frame of said core housing each respectively having a recessed edge; a front plate comprising a plurality of fastener apertures axially aligned with said fastener apertures in said frame of said core housing, said front plate comprising an upper arched opening and a lower arched opening separated by an intermediate band, and said front plate further comprising a power button aperture; a rear plate comprising a plurality of fastener posts protruding from an inner face of said rear plate, said fastener posts positioned in corners of said rear plate axially aligned with said fastener apertures in said core housing and said fastener apertures in said front plate, and said fastener posts positioned along a midline of said rear plate axially aligned with said fastener apertures positioned along a midline of said core housing; and an electronics tray secured within said groove of said front face of said core housing, said electronics tray comprising a plurality of fastener apertures axially aligned with said fastener apertures in said core housing, with said fastener apertures in said front plate and with said fastener posts positioned in said corners of said rear plate, said electronics tray further comprising a power source and a motherboard mounted thereto, said motherboard comprising a microprocessor, wireless and/or Bluetooth electronic hardware and at least one colored light source; further comprising a set of cutouts along an outer face of said rear plate; wherein said cutouts in said rear plate are covered by a box mounted to an inner face of said rear plate.

2. The device of claim 1 wherein said device has a height of about six (6) inches, a width of about three (3) inches, and a depth of about one and one-half (1½) inches.

3. The device of claim 1 wherein said recessed edge on said front face of said frame of said core housing has a thickness generally equal to a thickness of said front plate, and wherein said recessed edge on said rear face of said frame of said core housing has a thickness generally equal to a thickness of said rear plate.

4. The device of claim 3 wherein said front plate is generally flush with said front face of said frame of said core housing, and wherein said rear plate is generally flush with said rear face of said frame of said core housing.

5. The device of claim 1 wherein said core housing is constructed of a vibration absorbing material.

6. The device of claim 5 wherein said vibration absorbing material comprises a polymer rubber composite.

7. The device of claim 1 wherein said upper arched opening and/or said lower arched opening include a formed mesh insert.

8. The device of claim 1 wherein said electronics tray is constructed of an insulative material.

9. The device of claim 8 wherein said insulative material is aluminum.

10. The device of claim 1 wherein said power source is mounted to a rear face of said electronics tray, and wherein said motherboard is mounted to a front face of said electronics tray.

11. The device of claim 1 wherein said power source is a lithium ion battery.

12. The device of claim 1 wherein said light source further comprises three (3) light emitting diodes mounted to a front face of said motherboard, and wherein said light sources are aligned with said lower arched opening in said front plate of said device.

13. The device of claim 1 further comprising input components.

14. The device of claim 13 wherein said input components further comprise a micro USB port, an audio auxiliary port and an adjustable wheel to control the brightness of said light sources.

15. The device of claim 1 wherein said electronic hardware comprise a Bluetooth audio input chip, a Bluetooth audio output chip, and a Bluetooth communications chip.

16. The device of claim 1 wherein said electronic hardware consists essentially of a Bluetooth audio input chip, a Bluetooth audio output chip, and a Bluetooth communications chip.

17. The device of claim 1 further comprising physical device software, owner software, and user software.

* * * * *